United States Patent [19]

Araghi et al.

[11] Patent Number: 4,698,131
[45] Date of Patent: Oct. 6, 1987

[54] REPLACEABLE IMAGE SENSOR ARRAY

[75] Inventors: Mehdi N. Araghi, Webster; Jagdish C. Tandon, Fairport, both of N.Y.

[73] Assignee: Xerox Corporation, Stamford, Conn.

[21] Appl. No.: 808,799

[22] Filed: Dec. 13, 1985

[51] Int. Cl.⁴ .................. H01L 21/306; B44C 1/22
[52] U.S. Cl. ................... 156/647; 156/633; 156/659.1; 156/662; 357/32; 357/55; 357/60
[58] Field of Search ............ 156/629, 630, 633, 647, 156/659.1, 662; 357/32, 55, 60, 75

[56] References Cited

U.S. PATENT DOCUMENTS

| | | | |
|---|---|---|---|
| 4,182,025 | 1/1980 | Wickenden | 29/577 R |
| 4,467,342 | 8/1984 | Tower | 357/30 |
| 4,604,161 | 8/1986 | Araghi | 156/633 |

FOREIGN PATENT DOCUMENTS 640821 of 1962 Italy.
52-43370 5/1977 Japan .................. 156/647

Primary Examiner—Peter Hruskoci
Attorney, Agent, or Firm—Frederick E. McMullen

[57] ABSTRACT

An image sensor array and method of fabrication which facilitates replacement of a defective one in a series of arrays butted together to form a longer scanning array in which a (110) silicon wafer having a row of photosites has separation lines etched thereon by orientation dependent etching along the (111) planes, with the separation lines for the opposite ends of the array each consisting of first and second partial boundary lines longitudinally offset from one another connected by a third boundary line so that the ends of the array have a has a generally L-shaped offset permitting bi-directional separating and aligned inserting movement when replacing a defective array.

In a second embodiment, the arrays are formed on (100) silicon with alternating 'nail' head and 'mesa' head shapes to facilitate removal and replacement of a defective array.

4 Claims, 3 Drawing Figures

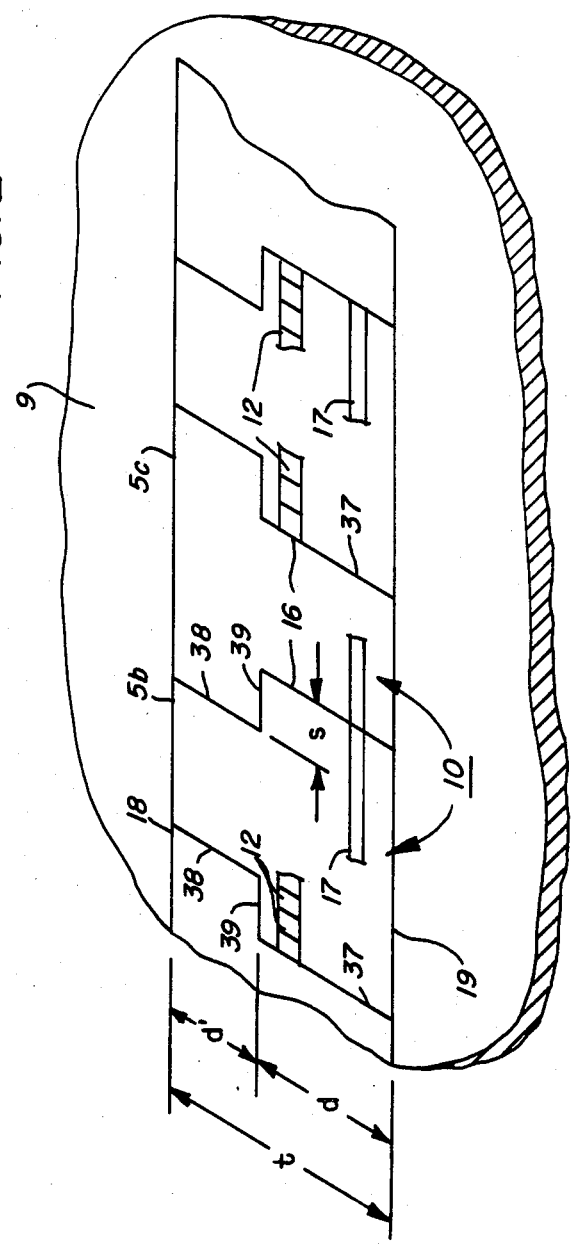

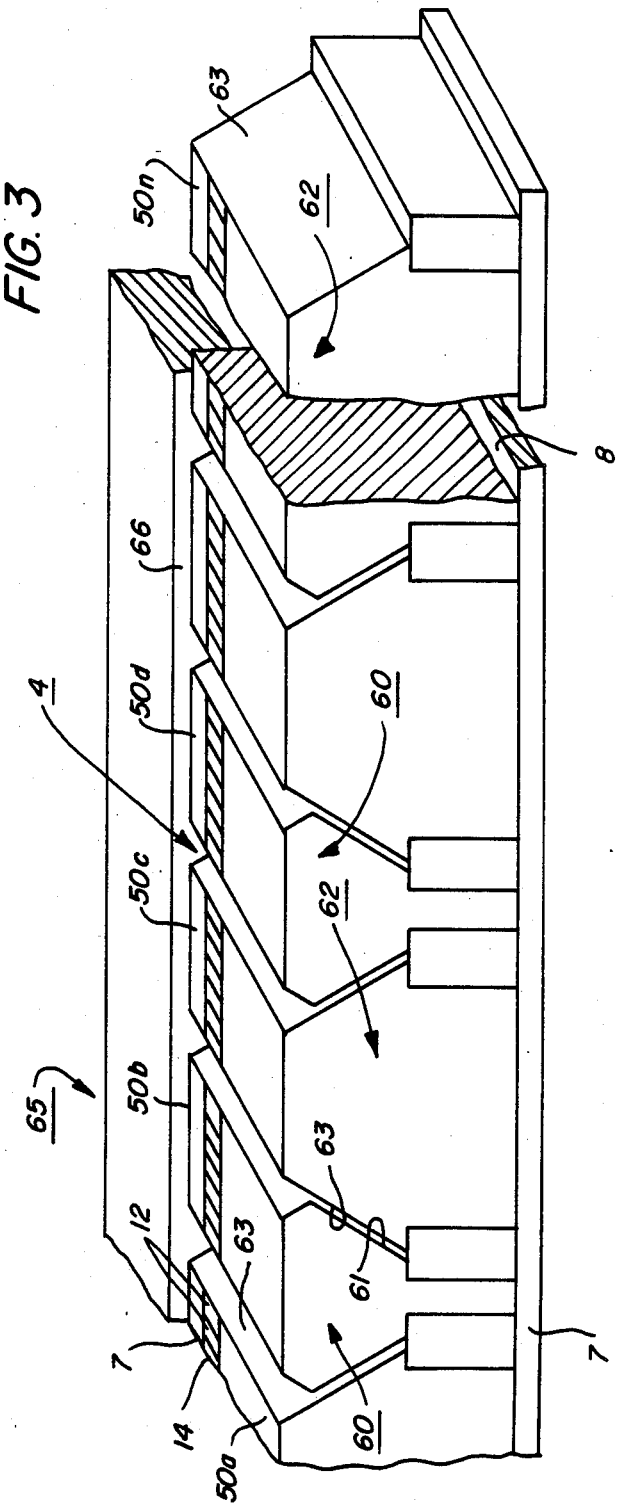

REPLACEABLE IMAGE SENSOR ARRAY

The invention relates to image sensor arrays and method of fabrication and more particularly, to an image sensor array fabricated to permit the array to be abutted with other like arrays to form a longer scanning array such that each of the smaller arrays has two degrees of freedom of movement to facilitate removal and aligned replacement of a smaller array without damage to neighboring arrays or distortion or loss of image at the array junctions.

Image sensor arrays for scanning document images, such as Charge Coupled Devices (CCD's), typically have a row or linear array of photosites together with suitable supporting circuitry integrated onto a substrate or chip. Usually, an array of this type scans an image line by line across the document width while the document is moved in synchronism therewith in a direction paralleling the document length.

The image resolution of an array of this type is proportional to the ratio of the length of scan and the number of array photosites. Because of the difficulty in economically designing and fabricating arrays with a large number of photosites on one chip, image resolution for the typical commercial array available today is relatively low. And while resolution may be improved electronically by interpolating extra image signals or pixels, or by using several sensor arrays and electrically interlacing the arrays with one another so as to switch in succession from one array to the next as scanning across the line progresses, electronic manipulations of this type is costly. Further, single or multiple array combinations of the type described usually require a more complex and expensive optical system to assure that the array or arrays accurately scan the image line without loss or distortion.

A single array equal in size to the width of the document to be scanned yet with a very large packing of photosites to assure the high resolution, often referred to as a full width or contact type array, is needed, but not available currently in the art. One concept that has been suggested is to form a longer array by butting several small arrays together. Since photosites can be closely packed on smaller arrays without substantial and costly reduction in yield rates, a longer array having the large number of photosites needed to achieve high resolution can be achieved in this fashion. At the same time, optical requirements are greatly simplified. However, the difficulty in later repairing composite arrays of this type and particularly the difficulty in removing and replacing a defective one of the smaller arrays without damaging the array photosites, or misaligning the arrays, or creating distortion and loss of image at the junctions between the arrays has heretofore necessitated in the event of a failure of one array that the entire full length array be replaced at substantial cost.

The present invention seeks to address and rectify the above by providing a sensor array of the type which is assembled with other arrays to form a full width scanning array which can be removed and replaced without damaging neighboring arrays and without affecting image quality, the sensor array comprising a chip fabricated in accordance with the following steps: forming at least one row of photosites on a relatively large (110) silicon wafer; orientation dependent etching edge separation lines in the wafer delineating the top and bottom edges of the chip; orientation dependent etching separation lines along the (111) plane of the wafer to delineate chip ends having a generally L-shaped offset therein; and separating the chip from the wafer along the separation lines to produce a generally rectangular-shaped chip, each end of the chip having a generally L-shaped offset for interlocking abutment and alignment with the complementary offset ends of other like arrays.

The invention further provides a replaceable array for use in combination with other arrays butted together end to end to form a longer scanning array comprising: a generally rectangular chip of (110) silicon having a predetermined width; at least one row of photosites extending longitudinally of the chip from one end of the chip to the other to provide on abutment of the chip with another like chip an uninterrupted row of photosites, each end of the array being defined by first and second end segments extending along the chip (111) plane, the combined length of the first and second end segments being equal to the chip width with the first and second end segments being offset longitudinally from one another, a third end segment extending along the chip (111) plane connecting the first and second end segments together whereby the first, second, and third end segments cooperate to form the array end, the third end segment being abuttable with the third end segment of a neighboring array to align the chip with the chip of a neighboring array when replacing a defective array.

IN THE DRAWINGS

FIG. 2 is an isometric view showing forming of the array chips on a larger silicon wafer; and FIG. 3 is an isometric view of an alternate embodiment in which the small sensor arrays are fabricated on (100) silicon to provide complementary 'nail' head and 'mesa' head shapes facilitating removal and replacement of a defective one of the arrays.

Figure 1:
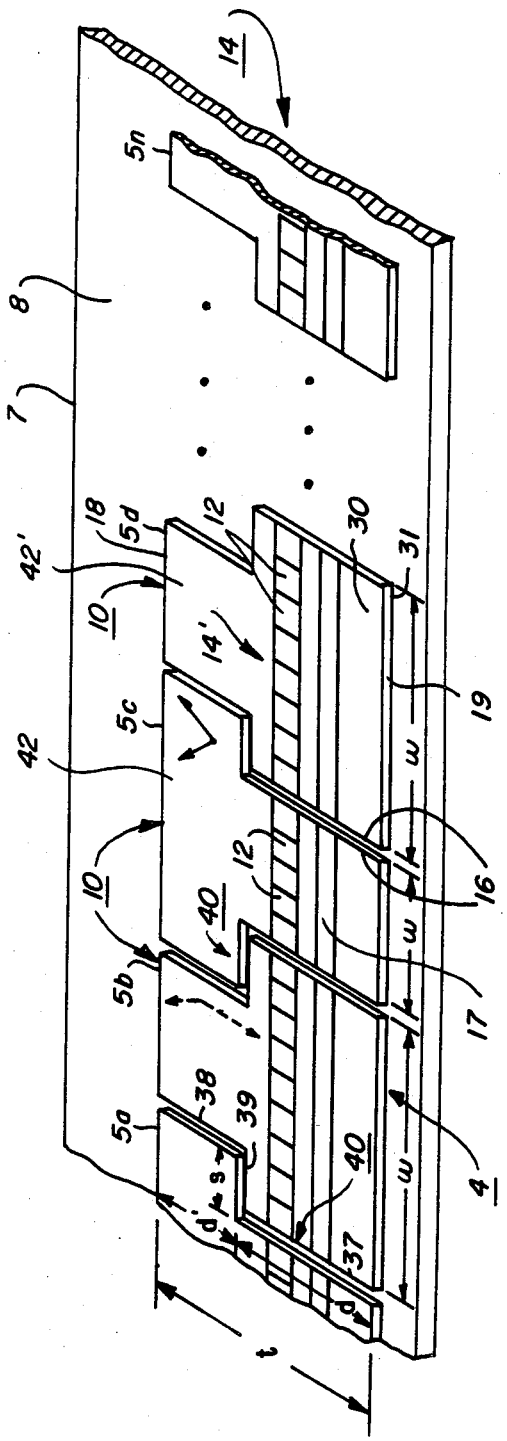
FIG. 1 is an isometric view of a plurality of small sensor arrays fabricated on (110) silicon in accordance with the invention and abutted together to form a full width scanning array, the small arrays having alternating complementary T and inverted T shapes designed to facilitate removal and replacement of a defective one of the small arrays.

Referring to FIG. 1 of the drawings, there is shown a long scanning array 4 composed of a plurality of small sensor arrays 5a, 5b, . . . 5n butted together end to end on a base or substrate 7. Substrate 7 which may be silicon, ceramic, or other suitable material, is generally rectangular in shape with a planar surface 8 supporting the arrays 5a, 5b, 5c, . . . 5n. A suitable adhesive such as an epoxy or solder is normally used to attach the arrays 5a, 5b, 5c, . . . 5n to the surface 8 of substrate 7 in desired position.

The small arrays 5a, 5b, . . . 5n, which may for example comprise Charge Coupled Device or CCD or NMOS type arrays, are fabricated in accordance with the teachings of the invention for easy repairability of the long scanning array 4 as will appear more fully hereinbelow. As will be understood by those skilled in the art, scanning array 4 is typically used to read or scan a document original line by line and convert the document image to electrical signals or pixels. Preferably, scanning array 4 is a full length or contact type array having an overall length equal to or slightly greater than the width of the largest document. Scanning array 4 has a row of 14 photosites 12 extending from one end to the other.

Each of the sensor arrays 5a, 5b, ... 5n has a crystalline silicon substrate or chip 10 with a row, i.e., array 14' of photosites 12 thereon. Typically, chips 10 are relatively thin with ends 16 and top and bottom edges 18, 19 respectively. The axis of the row 14' of photosites is parallel to the longitudinal axis of chip 10, with the photosite row extending between the chip ends 16. To form scanning array 4, the arrays 5a, 5b, ... 5n, are butted together end to end in aligned relation to form a continuous and uninterrupted row 14 of photosites.

While arrays 5a, 5b, ... 5n and hence scanning array 4 are shown as having a single row or array 14' of photosites 12, plural photosite rows or arrays may be contemplated. Additionally, other supporting circuits such as shift register 17 are preferably formed on chip 10 together with photosites 12. Suitable external connectors (not shown) are provided for electrically coupling the sensor arrays 5a, 5b, ... 5n to related external circuitry.

Referring to FIG. 2, chips 10 are fabricated from a larger wafer 9 of (110) silicon of the type commonly employed to make integrated circuits using orientation dependent etching to precisely delineate the chip ends 16 and the top and bottom edges 18, 19 respectively. Chips are then separated from the larger silicon wafer along the etched lines. Preferably, photosites 12 are formed prior to etching and separation of the chip from the silicon wafer.

As will be understood by those skilled in the art, (110) silicon has four (111) planes that intersect the (110) plane of the top and bottom surfaces 30, 31 of chip 10 at 90°. However, the (111) planes are not normal to each other but instead intersect at an acute angle of 75.53°. Therefore, ends 16 of chip 10 are not perpendicular to the top and bottom edges 18, 19 of chip 10 but instead are at an acute angle of 75.53° with respect thereto so that chips 10 are parallelogram-shaped. Photosites 12, which may for example be anisotropically etched and which have boundaries paralleling the ends 16 and the edges 18, 19 of the chip 10, are similarly parallelogram-shaped.

During fabrication of arrays 5, the chip ends are defined by etching at the point where separation is desired. In order not to impair or damage the photosites at the chip ends 16, the separation etch is made along a line running between or coincident with the boundary of the photosites where separation is to take place. The separation points for top and bottom edges 18, 19 may be similarly defined by etching. Thereafter, the chip is suitably separated along the etched lines. While photosites 12 are preferably formed prior to etching of chip 10, it will be understood that the photosites may be formed after chip 10 have been separated from the larger (110) silicon wafer.

Following assembly of the required number of small arrays 5a, 5b, 5c, ... 5n with one another, and prior to use, scanning array 4 is normally tested. Heretofore, in the event a failure of one of the arrays 5a, 5b, ... 5n is detected, the entire scanning array 4 would normally be scrapped. Similarly, where one of the small arrays fails during use, the entire scanning array 4 would normally be discarded and a new array substituted. This is due to the difficulty in extracting the failed array and replacing it with a new array without damaging either the neighboring arrays or the new array and in effecting the critical alignments necessary to provide a scanning array devoid of distortion.

The present invention permits a failed one of the small arrays 5a, 5b, ... 5n to be removed and replaced without necessitating replacement of the larger scanning array 4. For this purpose, the ends 16 of the array chips are formed with complementary interlocking boundary shapes designed to permit a damaged array to be removed and replaced with a new array without affecting or upsetting critical alignments between the arrays. In particular, the ends 16 of each chip 10 have a generally L-shaped offset or dog-leg formed therein which interlocks with the complementary shaped end of an adjoining chip, the complementary shaped ends permitting bi-directional movement of the array being withdrawn and of the replacement array being installed. At the same time, the L-shaped offset configuration enables the replacement array to be accurately located and aligned with the neighboring array or arrays.

During fabrication of small arrays 5a, 5b, 5c, ... 5n, the chip ends 16 are defined by a series of connecting etched lines. For this, an etch is made along the (111) plane at the desired separation point between photosites to a distance d to provide a first partial end boundary line 37. Preferably, distance d is of sufficient length to encompass, in addition to the row 14 of photosites 12, all of substantially all of the active circuits such as shift register 17 on chip 10. An etch is also made along the (111) plane at a point offset by a distance s from the line 37, the length of the etch being equal to the distance d' to form a second partial end boundary line 38. The sum of the distances d and d' are equal to the total distance t between sides 18,19 of the chip 10. An etch is also made along the (111) plane parallel to the longitudinal axis of the chip joining the boundary lines 37,38 and forming a third end boundary line 39 to complete the definition of the chip end. the length of the third boundary line is equal to the distance s. As a result, boundary lines 37, 38,39 cooperate to define chip ends with a L-shaped offset or dog-leg therein.

When the etches, which may be made simultaneously or in any desired sequence as will be understood, are complete, the chips are separated from the wafer along the lines 37, 38, 39 to provide chips which are either in the shape of a T or of an inverted T. This permits interlocking of the small arrays 5a, 5b, ... 5n with one another when forming scanning array 4 while providing the bi-directional movement that enables later removal and replacement of one or more of the small arrays 5a, 5b, ... 5n in the larger scanning array 4. In the example depicted in FIG. 1, arrays 5a, 5c, have a generally T-shape with a relatively larger area 42 adjoining the normally unused top edge 18 while arrays 5b, 5d which have the shape of an inverted T with a relatively smaller area 42' adjoining the unused top edge 18.

When a defective array as for example array 5c is detected, local heating is applied to the array to free the defective array from surface 8 of substrate 7 and from neighboring arrays 5b and 5d. With the array 5c released, the array may be extracted by both a lifting and sliding motion relative to substrate 7 and the adjoining arrays 5b and 5d as shown by the solid line arrows in FIG. 1. It is understood that where an array having an inverted T-shape is replaced such as array 5b, the direction of movement along the plane of the scanning array 4 is reversed as shown by the dotted line arrows.

Replacing the array is the reverse of the above, the replacement array 5c being inserted in the space vacated by the defective array, with the L-shaped offset in the ends of the replacement array interlocking with the complementary ends of the neighboring arrays 5b and 5d. In addition, the portion of ends 16 delineated by boundary line 38 serves to locate and align the row 14' of photosites 12 of the replacement array 5c with the rows 14' of photosites 12 of neighboring arrays 5b and 5d on either side to again form a continuous and uninterrupted scanning array 4.

The aforedescribed two dimensional freedom of movement allows multi-directional movement of an array during removal or reinsertion, i.e., from lateral movement in a plane paralleling the surface of substrate 7 to upward lifting movement, and various combinations of lateral and lifting movement.

While the widths w, w' across the base portion of alternate chips 5a, 5b, ... 5n is illustrated as being different with resulting difference in the number of photosites in every other array, it will be understood that the width w, w' may be made equal to one another. In that case, the number of photosites 12 on each chip will be equal to one another.

In the embodiment shown in FIG. 3, where like numbers refer to like parts, scanning array 4 comprises a combination of smaller arrays 50a, 50b, 50c, ... 50n formed on (100) silicon. As will be understood by those skilled in the art, (100) silicon has four (111) planes which intersect the (110) surface at an acute angle of 75.53°. Arrays 50a, 50b, 50c, ... 50n may be fabricated in the manner taught by copending U.S. application Ser. No. 729,705, filed May 2, 1985, entitled "Method of Fabricating Image Sensor Arrays" in the name of Mehdi N. Araghi.

To permit replacement of a defective array, the chip shapes for the small arrays 50a, 50b, 50c, ... 50n alternate between a 'nail' head shape 60 and a 'mesa' head shape 62. As a result, the sloping end borders 61 of the 'nail' head chips, which alternate with the 'mesa' head chips, border on the mating sloping end borders 63 of the 'mesa' head chips on assembly of the desired number of small arrays 50a, 50b, 50c, ... 50n with one another on substrate 7 to form a scanning array 4 of desired length. When it is desired to replace one of the small arrays having a 'nail' head shape 60, as for example, array 50b, local heating is applied to free the defective array 50b from the surface 8 of substrate 7 and the adjoining arrays 50a and 50c. Once set free, the defective array 50b may be simultaneously lifted and slide either forward or backward to remove the array.

To replace the defective array with a new array, an alignment tool 65 having a planar array aligning surface 66 is positioned so that aligning surface 66 abuts against the remaining arrays 50a, 50c, ... 50n of scanning array 4. the new array 50b is then inserted, and by a combination sliding and downward motion, the new array is fitted into place between the neighboring arrays 50a and 50c. The edge of the replacement array is abutted against the aligning surface 66 of tool 65 to align the row 14' of photosites 12 of the replacement array with the rows 14' of photosites 12 of the neighboring arrays 50a, 50c. Following alignment, the replacement array 50b is secured in place by a suitable adhesive.

In the case where an array having a 'mesa' head shape 62 is defective and requires replacement, such as array 50c, the 'nail' head shaped array on one side, i.e., either array 50b or 50d is first removed in the manner described above in order to free the 'mesa' head shaped array for removal. Following this, the defective 'mesa' head array 50c is removed in the manner described and a replacement array having a 'mesa' head shape 62 placed on the surface 8 of substrate 7 in abutting end to end relation with the neighboring 'nail' head array on substrate 7. The previously removed 'nail' head array is then replaced and both the new 'mesa' head array and the 'nail' head array aligned against the aligning surface 66 of tool 65 to align the rows 14' of photosites 12 with the rows of photosites of the arrays already in position on substrate 7. Once the new 'mesa' head array together with the previously removed 'nail' head array are in position, the arrays are locked in place by a suitable adhesive.

While the invention has been described with reference to the structure disclosed, it is not confirmed to the details set forth, but is intended to cover such modifications or changes as may come within the scope of the following claims.

We claim:

1. A method of fabricating a sensor array on a chip for assembly with other like arrays in abutting end to end relationship to form a longer composite array and which is capable of being removed and replaced without damaging the other arrays or causing loss of image quality, comprising the steps of:
   (a) forming at least one row of photosites on a relatively large (110) silicon wafer;
   (b) orientating dependent etching edge separation lines along the (111) plane of said wafer to delineate the top and bottom edges of said chip;
   (c) orientating dependent etching end separation lines along the (111) plane of said wafer to delineate chip ends having a generally L-shaped offset therein by etching a first separation line between two adjacent photosites in said photosite row extending from one edge of said chip toward the chip interior, a second separation line longitudinally offset from the first separation line and extending from a point spaced opposite the terminus of said first separation line to the other edge of said chip, and a third separation line connecting the termini of the first and second separation lines, said first, second and third lines cooperating to form end separation lines with said generally L-shaped offset; and
   (d) separating said chip from said wafer along said separation lines to provide a generally rectangular shaped chip, each end of said chip having a generally L-shaped offset for interlocking abutment and alignment with complementary offset ends of other like arrays.

2. The method according to claim 1 including the step of:
   offsetting said second separation line outwardly of said first separation line whereby on separation of said chip from said wafer, a generally T-shaped chip is formed.

3. The method according to claim 1 including the step of:
   offsetting said second separation line inwardly of said first separation line whereby on separation of said chip from said wafer, a generally inverted T-shaped chip is formed.

4. A method of fabricating a sensor array on a chip for assembly with other like arrays in abutting end to end relationship to form a longer composite array and which is capable of being removed and replaced without damaging the other arrays or causing loss of image quality, comprising the steps of:
   (a) orientating dependent etching edge separation lines along the (111) plane of a relatively larger (110) silicon wafer to delineate the top and bottom edges of said chip;

(b) orientating dependent etching end separation lines along the (111) plane of said wafer to delineate chip ends having a generally L-shaped offset therein by etching a first separation line extending from one edge of said chip toward the chip interior, a second separation line longitudinally offset from the first separation line and extending from a point spaced opposite the terminus of said first separation line to the other edge of said chip, and a third separation line connecting the termini of the first and second separation lines, said first, second and third lines cooperating to form end separation lines with said generally L-shaped offset; and (c) separating said chip from said wafer along said separation lines to provide a generally rectangular shaped chip, each end of said chip having a generally L-shaped offset for interlocking abutment and alignment with the complementary offset ends of other like arrays; and (d) forming at least one row of photosites on said silicon wafer.

* * * * *